United States Patent [19]

Brzezinski

[11] Patent Number: 5,323,292
[45] Date of Patent: Jun. 21, 1994

[54] INTEGRATED MULTI-CHIP MODULE HAVING A CONFORMAL CHIP/HEAT EXCHANGER INTERFACE

[75] Inventor: Dennis Brzezinski, Sunnyvale, Calif.

[73] Assignee: Hewlett-Packard Company, Palo Alto, Calif.

[21] Appl. No.: 957,309

[22] Filed: Oct. 6, 1992

[51] Int. Cl.⁵ .............................................. H05K 7/20
[52] U.S. Cl. .................................. 361/689; 165/80.4; 165/165; 165/104.33; 257/714; 361/699
[58] Field of Search ............ 165/46, 80.4, 185, 104.33; 174/16.3, 15.1; 257/707, 712, 714, 721; 361/382–383, 385–389

[56] References Cited

U.S. PATENT DOCUMENTS

| | | | |
|---|---|---|---|
| 3,593,064 | 7/1971 | Wagner et al. | 361/388 |
| 4,072,188 | 2/1978 | Wilson et al. | 165/80 |
| 4,092,697 | 5/1978 | Spaight | 361/386 |
| 4,109,707 | 8/1978 | Wilson et al. | 165/46 |
| 4,531,146 | 7/1985 | Cutshaw | 357/82 |
| 4,612,978 | 9/1986 | Cutchaw | 165/104.33 |
| 4,750,086 | 6/1988 | Mittal | 361/382 |
| 4,771,365 | 9/1988 | Cichocki et al. | 361/387 |
| 4,879,629 | 11/1989 | Tustaniwskyj et al. | 361/385 |
| 4,933,747 | 6/1990 | Schroeder | 357/82 |
| 4,938,279 | 7/1990 | Betker | 165/46 |
| 4,964,458 | 10/1990 | Flint et al. | 165/80.4 |
| 4,997,032 | 3/1991 | Danielson et al. | 165/46 |
| 5,000,256 | 3/1991 | Tousignant | 165/46 |
| 5,001,548 | 3/1991 | Iversen | 357/82 |
| 5,006,924 | 4/1991 | Frankeny et al. | 357/82 |
| 5,046,552 | 9/1991 | Tousignant | 165/46 |
| 5,050,037 | 9/1991 | Yamamoto et al. | 361/385 |
| 5,157,588 | 10/1992 | Kim et al. | 361/386 |
| 5,168,348 | 12/1992 | Chu et al. | 257/713 |
| 5,177,667 | 1/1993 | Graham et al. | 361/385 |

FOREIGN PATENT DOCUMENTS

| | | |
|---|---|---|
| 0103067A2 | 3/1984 | European Pat. Off. . |
| 243710A2 | 11/1987 | European Pat. Off. . |
| 2354260 | 6/1974 | Fed. Rep. of Germany ...... 361/385 |

OTHER PUBLICATIONS

Parsapour "Convection Cooling In Small Terminals", IBM Technical Disclosure Bulletin, vol. 24, No. 2, Jul. 1981, p. 1222.

Primary Examiner—Gregory D. Thompson

[57] ABSTRACT

A multi-chip module having a conformal heat transfer interface to adapt to variations in the height and angle of integrated circuit chips and to achieve a thermal energy path between each chip and a heat sink. The conformal heat transfer interface includes a deformable metallic membrane and a liquid under pressure. The liquid has a high thermal conductivity and provides a pressure for deforming the metallic membrane to compensate for non-coplanarity of the chips. The module integrates the structural support, RF shielding, contamination-protection elements, and the heat-dissipating mechanism that are desired in the design of multi-chip modules. Double-sided cooling of the module significantly improves the thermal characteristics of a module, even in the absence of the conformal heat transfer interface.

14 Claims, 3 Drawing Sheets

INTEGRATED MULTI-CHIP MODULE HAVING A CONFORMAL CHIP/HEAT EXCHANGER INTERFACE

DESCRIPTION

1. Technical Field

The present invention relates generally to integrated circuit packages and more particularly to modules having an array of integrated circuit chips electrically connected to a substrate within the module.

2. Background Art

Modules which package a number of integrated circuit chips play an increasingly important role in the electronics industry. The chips within a module may be functionally equivalent, such as an array of memory chips to provide a capability of forty megabytes. Alternatively, the chips may be functionally related, such as a chip set comprising a read only memory chip, a random access memory chip, a microprocessor and an interface chip.

One problem with multi-chip modules is that the increase in the number of chips confined within a single area increases the importance of providing adequate cooling. U.S. Pat. Nos. 5,006,924 to Frankeny et al., 5,001,548 to Iversen, 4,879,629 to Tustaniwskyj et al. and 4,750,086 to Mittal all describe use of a liquid coolant that is forced to flow through a multi-chip module to absorb thermal energy, whereafter the liquid coolant is removed from the module at an outlet port. Providing a liquid coolant loop through a module is an effective way of ensuring adequate cooling, but is an expensive cooling method. Requiring a mechanism for providing a forced flow of liquid coolant would be cost inefficient in such applications as computer work-stations.

For small and medium scale applications in which forced liquid cooling is not an option, heat spreaders, or sinks, are used to dissipate thermal energy into the atmosphere surrounding the multi-chip module. Particularly for high power chips that generate a significant amount of thermal energy, this places an importance on the thermal path from the chips to the exterior of the heat spreader. Ideally, contact is made between the integrated circuit chips and the structure that begins the thermal path to the surrounding atmosphere. A difficulty with this ideal is that during the fabrication of a manufacturing lot of multi-chip modules, there will be differences among the modules and even among the various chips within a single module. For example, chips are often encased within a carrier before being mounted to a substrate. The carriers may have slight differences in height and/or the mounting of the chips to the substrate may result in slight variations in height or angle with respect to the component surface of the substrate. Various fabrication and machine tolerances are additive, so that the chips within a multi-chip module will not have coplanar upper surfaces. A bellows assembly with forced liquid cooling, such as described in the Mittal and Tustaniwskyj et al. patents, may be used where cost is not a major concern, but ensuring adequate contact between individual chips and a heat dissipating structure is more difficult in many applications.

Alternatively, thermally conductive pillows may be placed between the heat spreader and the chips, as described in U.S. Pat. Nos. 5,000,256 to Tousignant, 4,997,032 to Danielson et al. and 4,092,697 to Spaight. For example, Spaight describes an electrically nonconductive film contacting a single chip at a first side of the nonconductive film and containing a thermal liquid material at a second side.

It is an object of the present invention to provide a multi-chip module that achieves an adaptive heat transfer interface without forced liquid cooling and provides an electrical path to semiconductor chips of the module.

SUMMARY OF THE INVENTION

The above object has been met by a stand-alone module having a fixed and generally static volume of liquid which interacts with a membrane to achieve a conformal interface that compensates for variations in heights and angles among semiconductor chips within the module. The module is a fully integrated member that does not require connection to plumbing or the like. The liquid is contained within a fluid-tight chamber, with the liquid serving the dual purpose of providing a mechanism for ensuring proper deformation of the membrane and defining a portion of the thermal path from the chips to the surrounding atmosphere. The thermal path comprises the membrane, the generally static liquid and at least one heat exchanger. The membrane serves the dual purpose of providing a deformable structure and forming an electrical connection to passive surfaces of the semiconductor chips.

The module includes a substrate onto which the semiconductor chips are mechanically and electrically mounted. While not critical, the substrate is a silicon substrate and the chips are surface mounted using a solder bump technique. A silicon substrate provides a high degree of flatness, thereby reducing variations in thickness of the substrate as a source of non-coplanar chips. Moreover, silicon is better matched to the chips in terms of the thermal coefficients of expansion than are standard printed circuit board materials.

The heat exchanger is fixed to the substrate at the component surface of the substrate. A fluid-tight chamber is defined between the membrane and the heat exchanger. The fixed volume of liquid is contained within the fluid-tight chamber. Preferably, the liquid is under pressure by the entrapment between the heat exchanger and the membrane, so that the liquid presses the membrane outwardly. The membrane extends generally parallel to the chips. The liquid pressing against the membrane ensures a compression contact of the membrane against each semiconductor chip, regardless of variations in heights and angles.

The membrane is made of an electrically conductive material that forms an electrical path from the grounded heat exchanger to the back sides of the semiconductor chips. This grounding provides an advantage over typical prior art structures, since the grounding of chips containing CMOS devices is often desirable.

An advantage of the present invention is that it provides a conformal heat flow path from the chips to the heat exchanger. Heat is channeled from the chips to the thermally conductive membrane and liquid and then to the heat exchanger where the energy can be dissipated into the surrounding atmosphere. In a preferred embodiment, the membrane is made of a metal, such as stainless steel, and the liquid is distilled water having a concentration of additive that retards oxidation of the membrane and the heat exchanger. The conformal thermal interface not only allows adaption to differences in chip heights and chip angles resulting from manufacturing tolerances, but also provides a strain release for chip expansion during operation. The chip expansion varies with the thermal coefficients of expansion of the chips and the material used to form any chip carriers. Preferably, the stainless steel membrane has a thickness in the range of 0.0005 inch and 0.001 inch. A membrane that is too thin will be unreliably fragile, whereas a membrane that is too thick will not have the necessary conformity.

As compared to traditional packaging which merely employs a heat sink, the present invention achieves a greater cooling capability. This is particularly true where a second heat exchanger is attached to the substrate at the side opposite to the component surface. Optionally, integrated circuit chips may be mounted on both major surfaces of the substrate. The double-sided substrate can then be entrapped between two conformal interfaces, each comprising a thermally conductive membrane and a static body of liquid entrapped between the membrane and a heat exchanger.

Utilizing the present invention, higher power integrated circuit chips can be placed closer together at a lower and more uniform temperature. Closer component spacing allows higher performance products, since electrical paths can be shortened. Moreover, lower component junction temperatures yield higher performance as well as increased component reliability. It is predicted that an improvement of thirty-four percent in the gate delay for CMOS circuits can be achieved.

The present invention integrates structural support, protection from the external environment, radio frequency shielding and a conformal heat transfer interface. Thus, replacement merely requires removing a module from a motherboard and plugging in a replacement module. Plumbing connections to an external source of liquid coolant are not necessary. Nor is it necessary to provide secondary housing to contain RF radiation, since grounding the heat exchangers sufficiently protects against RF radiation leakage.

Also disclosed is a module having double-sided cooling. First and second heat sinks are mounted at the opposed major surfaces of a multi-chip substrate. A first thermal energy flow path is from the chips to the first heat sink for dissipation into the surrounding atmosphere. A second thermal energy flow path is from the chips to the substrate and then to the second heat sink. The double-sided feature significantly improves the thermal characteristics of a multi-chip module.

BEST MODE FOR CARRYING OUT THE INVENTION

Figure 1:
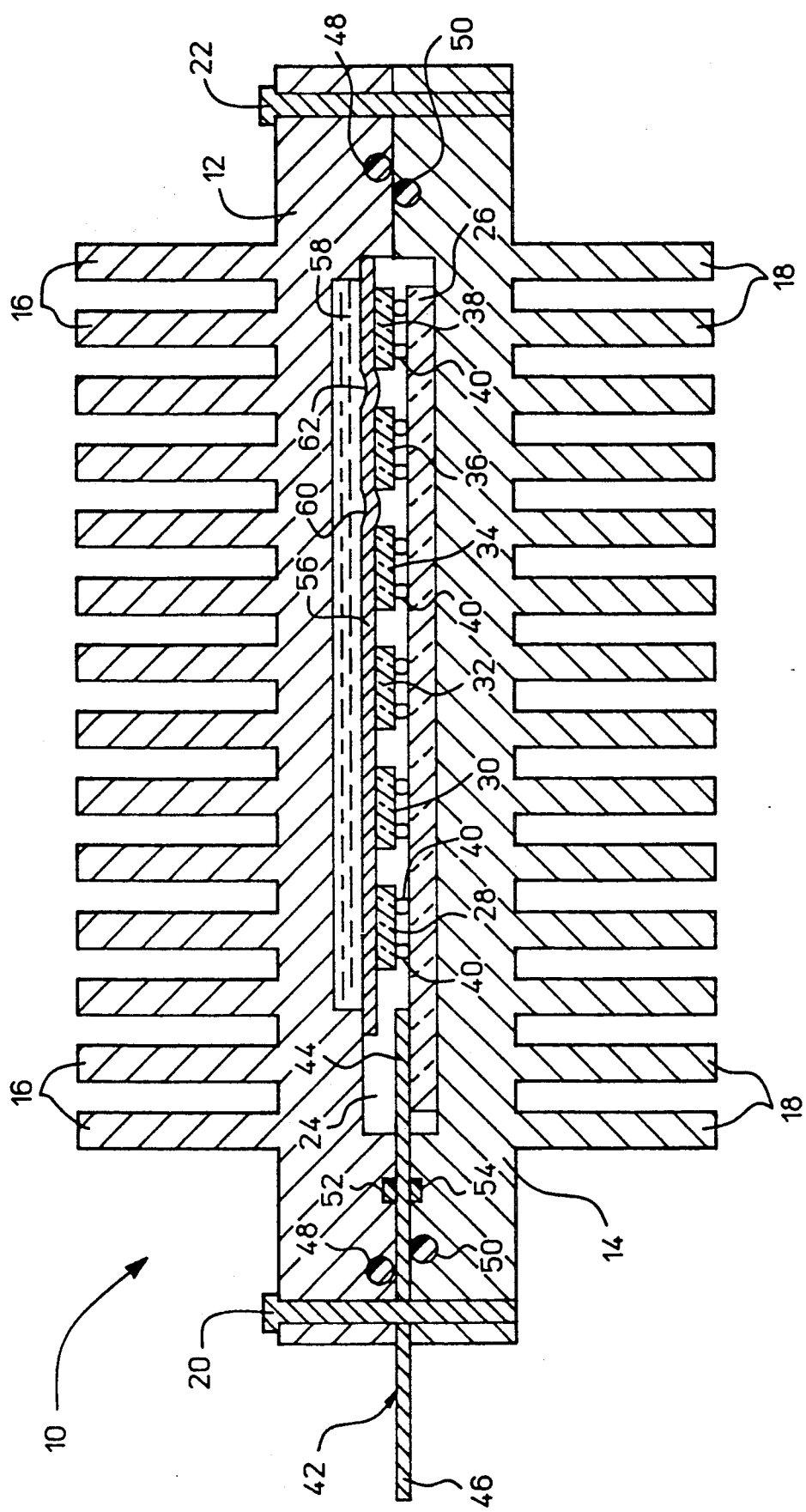
FIG. 1 is a side sectional view of a multi-chip module having a double sided heat exchanger and having a conformal heat interface in accordance with the present invention.

With reference to FIG. 1, a multi-chip module 10 includes first and second heat exchangers, or heat sinks 12 and 14. The heat sinks include parallel fins 16 and 18 that provide a greater surface area for dissipating heat into the surrounding atmosphere. Finned heat sinks made of aluminum or an aluminum alloy are known in the art.

The first and second heat sinks 12 and 14 are held together by two or more screws 20 and 22. The screws are externally threaded members that tighten into internal threads of the second heat sink.

The first and second heat sinks 12 and 14 have center recesses that define a substrate chamber 24 when the heat sinks are fastened together. Within the substrate chamber 24 is a substrate 26 for the mounting of integrated circuit chips 28, 30, 32, 34, 36 and 38. In a preferred embodiment, the substrate 26 is a silicon substrate. The silicon substrate provides a match of the thermal coefficient of expansion of the integrated circuit chips 28-38. The coefficient of thermal expansion of the silicon substrate, as compared to standard printed circuit board materials, also provides a close match with the coefficient of solder bumps 40 used in electrically connecting the chips 28-38 to the substrate. The matching of coefficients is important in minimizing the potential of damage that can result from mechanical stresses induced during operation of the module 10.

The solder bumps 40 electrically and mechanically connect the chips 28-38 to the silicon substrate 26. The solder bumps are formed in a conventional manner on the input/output and the utility pads on the active side of the chips. While the chips are shown as being carrier-less chips, this is not critical. Moreover, other methods of connecting the chips to the silicon substrate may be used.

Circuit traces, not shown, along the silicon substrate 26 interconnect the integrated circuit chips 28-38 and bring signals and utilities of the chips to and from an edge of the silicon substrate. A tape automated bonding frame 42 has inner lead ends 44 that are bonded to the edge of the silicon substrate at input/output contacts, not shown. Outer lead ends 46 extend to the exterior of the module 10 for connection to a connector, a printed circuit board or the like. Preferably, the tape automated bonding frame 42 is a multi-level assembly, having an array of generally parallel metal leads on each level. However, other types of interconnect assemblies may be used. Additionally, the tape automated bonding frame may extend from more than one edge of the silicon substrate.

A pair of O-ring seals 48 and 50 protect the substrate chamber 24 from particle contaminants that may otherwise enter between the first and second heat sinks 12 and 14. The tape automated bonding frame 42 is trapped between the two seals 48 and 50. Strips of sealing tape 52 and 54 are also used to protect the substrate surface 24. In addition to protection from particle contaminants, the O-rings and the sealing tape prevent entrance of corrosion-inducing matter. In place of the O-rings, a composition of epoxy and polyimide may be injected.

The passive side of each integrated circuit chips 28-38 is the major side opposite to the solder bumps 40. Ideally, the passive sides of the chips are coplanar. However, various manufacturing limtations will cause differences in the heights and the angles of the chips relative to each other and to the silicon substrate 26. As described above, one reason for forming the substrate 26 out of silicon is to provide a better matching of coefficients of thermal expansion, as compared to standard printed circuit board materials. A second reason for selecting silicon is that a greater degree of flatness can be achieved without difficulty. However, differences among the chips can still result from variations in such factors as solder bump attachment, tolerances in the formation of the substrate contacting surface of the second heat sink 14, and variations in the fabrication of the chips themselves and any carriers that may be integral with the chips.

The present invention includes a conformal heat transfer interface between the chips 28-38 and the first heat sink 12, thereby compensating for any noncoplanarity among the passive sides of the chips. Compensation maximizes the efficiency of conducting thermal energy from the chips 28-38 to the atmosphere surrounding the module 10.

A first element of the conformal heat transfer interface is a metallic membrane 56. The metallic membrane should be thin, chemically stable and thermally conductive. A length of stainless steel having a thickness in the range of 0.0005 inch and 0.001 inch may be fastened to the first heat sink 12. Thinness is a concern for most thermally conductive materials because such materials typically are not easily conformed to the shape of contacting surfaces when the membrane is thick. However, a membrane that is too thin is unreliably fragile. The membrane should be made of a ductile, tear-resistant material.

As shown in FIG. 1, the ends of the metallic membrane 56 contact the first heat sink 12. The ends may be fastened to the first heat sink in any conventional manner which is heat-resistant. For example, fastening members, not shown, may be used or a heat-resistant adhesive may be employed.

A portion of the metallic membrane 56 is spaced apart from the first heat sink 12 to define a second chamber in which a thermally conductive fluid 58 is contained. The volume of the fluid is such that it completely fills the second chamber to provide a thermal path from the metallic membrane 56 of the first heat sink 12 and so that the fluid exerts a pressure on the metallic membrane even when the module 10 is installed in a vertical position, rather than the horizontal position shown in FIG. 1.

The thermally conductive liquid preferably includes distilled water, but this is not critical. The preferred liquid is distilled water with ten percent ethylene glycol. The ethylene glycol is antibacterial and retards oxidation on the aluminum heat sink 12 and metallic membrane 56. Substitutes are available. Phase-change salts which quickly give up energy when caused to boil are known, but are typically more expensive. A synthetic freon sold under the trademark Fluorinert by 3M Corp. may be substituted. However, in selecting a filler for the volume between the metallic membrane 56 and the first heat sink 12, viscosity is a concern. The thermal coefficients of the semiconductor chips 28-38 and the aluminum heat sinks are not closely matched. The temperature within the substrate chamber 24 may reach 100° C. Thus, it is advantageous to have a filler that is easily displaced, such as distilled water, rather than a material such as grease which flows more slowly.

In operation, the module 10 may be connected merely by attaching a connector to the outer lead ends 46 of the tape automated bonding frame 42. The connection of plumbing to the module is not necessary, since the thermally conductive fluid 58 is sealed within the module. During manufacture, the metallic membrane 56 conforms to variations in the heights and angles of the integrated circuit chips 28-38. The thermally conductive fluid 58 provides a pressure for conforming the metallic membrane to the passive sides of the chips, thereby providing an efficient heat transfer path from the chips to the first heat sink 12. In FIG. 1, the integrated circuit chips 28, 30, 32 and 34 have coplanar passive sides, while the integrated circuit chip 36 is slightly higher. The difference in height of the chip 36 does not detrimentally affect the thermal exchange relationship between either the chip 36 and the metallic membrane 56 or the other chips 28-34 and 38 with the metallic membrane. Rather, minor deformations 60 and 62 of the membrane at opposite sides of the chip 36 ensure that the membrane lies in close contact with each of the integrated circuit chips.

The integrated circuit chips 28-38 are not necessarily of the same type. Different chips within the module 10 may perform different roles and may have varying heat-generating characteristics. Thus, the integrated circuit chip 36 may expand to a greater degree than the remaining chips 28-34 and 38. Again, the conformal heat transfer interface that comprises the metallic membrane 56 and the thermally conductive fluid 58 will conform to variations among the chips.

The metallic membrane 56 forms an electrical path from the integrated circuit chips 28-38 to the heat sink 12. Typically, the heat sink is grounded. The electrical path provides a desired ground to the back sides of the chips.

To maximize the thermal interface, a synthetic thermal grease may be used to coat the passive sides of the integrated circuit chips 28-38, thereby filling any minute crevices that are sometimes formed in the fabrication of integrated circuit chips. The synthetic thermal grease should also be used at the interface of the silicon substrate 26 and the second heat sink 14. In addition to the reasons noted above for using a silicon substrate, another reason is the thermal conductivity of silicon is greater than that of conventional printed circuit board materials. Thermal energy can be conducted from the substrate chamber 24 via the second heat sink as well as the first heat sink 12.

Utilizing the embodiment of FIG. 1, a multichip module 10 that is an integrated unit, i.e. a unit that does not require attachment to plumbing, may be manufactured with a significant improvement in the cooling capability relative to conventional modules. By lowering the temperature of each chip 28-38 and by ensuring a greater temperature uniformity among the chips, the chips can be placed closer together. Closer component spacing allows higher performance products, since the delays associated with long electrical paths among components are eliminated. Moreover, lower component junction temperatures are achieved, yielding a higher performance module.

The multi-chip module 10 encases the integrated circuit chips 28-38 and the substrate 26 within the aluminum heat sinks 12 and 14, thereby achieving a high degree of RF shielding. Operating frequencies of 500 Mhz are anticipated. Radiation leakage from the multi-chip module could adversely affect surrounding circuitry. Particularly if the heat sinks are connected to ground potential, the multi-chip module offers protection against the radiation of RF energy from the module and the reception of RF energy by components and printed circuit traces within the module.

Figure 2:
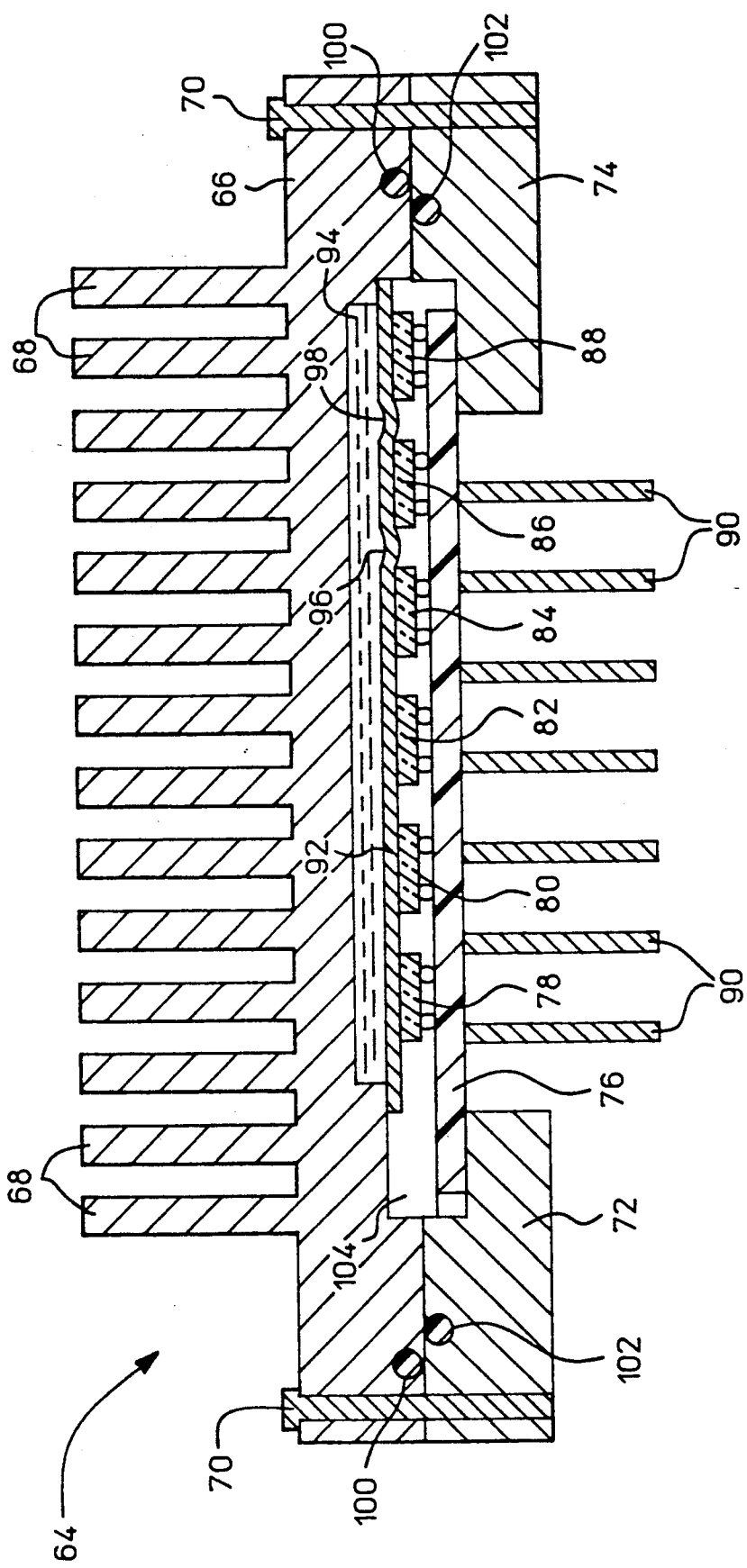
FIG. 2 is a side sectional view of a second embodiment of a multi-chip module having a conformal heat interface with an array of semiconductor chips.

A multi-chip module 64 having a single-sided heat exchanger 66 is shown in FIG. 2. The heat exchanger includes a number of parallel fins 68 to achieve the desired surface area for the release of thermal energy into the atmosphere. Screws 70 are received within internally-threaded bores of plates 72 and 74 to secure a printed circuit board 76 to the heat exchanger. Unlike the embodiment described above, the printed circuit board 76 is made of any one of the conventional materials for fabricating circuit boards to electrically interconnect a number of integrated circuit chips 78, 80, 82, 84, 86 and 88. Electrical communication between the module 64 and a motherboard or the like is achieved via metallic pins 90 that can be soldered into throughholes in the motherboard.

The module 64 includes a conformal heat transfer interface comprising a thin metallic membrane 92 and a thermally conductive liquid 94. The metallic membrane is a strip of stainless steel having a thickness of 0.001 inch. The liquid is preferably a solution of ninety percent distilled water and ten percent ethylene glycol having a thickness of 0.04 inch. The liquid exerts a maximum pressure of approximately three pounds per square inch on the metallic membrane, but this is not critical. This pressure ensures that the metallic membrane contacts the entire upper surface of each integrated circuit chip 78-88 regardless of variations in height and angle relative to the printed circuit board 76. Deformations 96 and 98 of the metallic membrane will occur to accommodate non-coplanarity of the upper surfaces of the integrated circuit chips.

A pair of O-rings 100 and 102 protect a substrate chamber 104 that houses the integrated circuit chips 78-88. While the single-sided cooling of FIG. 2 provides a somewhat lesser degree of cooling than the double-sided cooling of FIG. 1, both embodiments provide an integration of the structural support, protection from the external environment and the conformal heat transfer interface that allows production of an inexpensive but thermally efficient multi-chip module.

The integrated circuit chips 78-88 may be the carrierless type or may be integrated with a chip carrier. It is also possible to provide a thermally conductive post between each chip and the metallic membrane. Such posts can be manufactured to achieve a flatness that might not be achievable at the passive sides of the integrated circuit chip.

Figure 3:
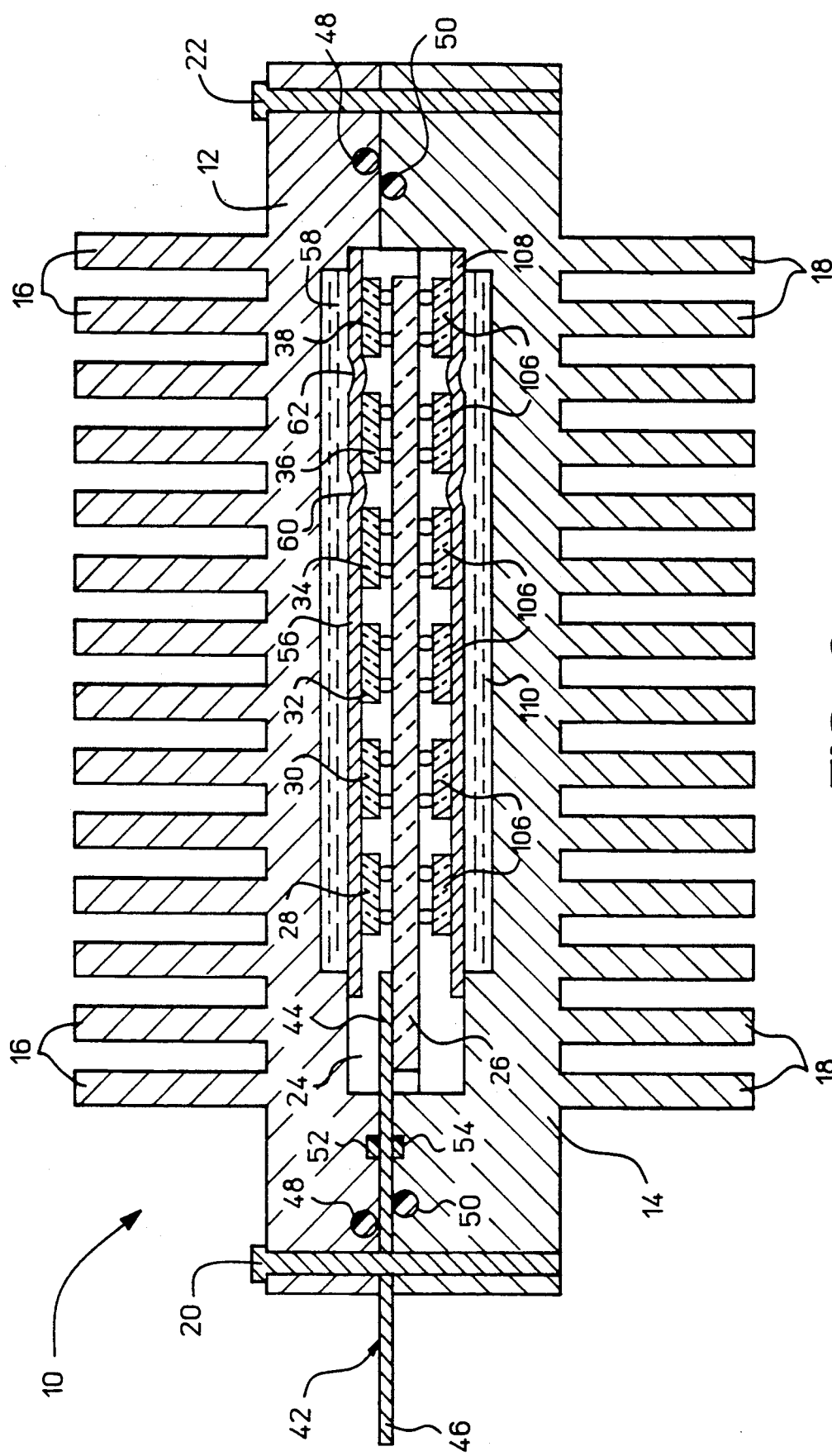
FIG. 3 is a side sectional view of a third embodiment of a multi-chip module, including integrated circuit chips mounted on both sides of a substrate.

While the present invention has been described and illustrated as having chips on only one side of a substrate, it is possible to connect chips at both sides. Referring now to FIG. 3, a second array of integrated circuit chips 106 is mounted to the bottom side of the silicon substrate 26 and a second heat transfer interface comprising a metallic membrane 108 and a liquid 110 under pressure is used to provide a thermal energy path from the chips 106 to the second heat sink 14. The double-sided substrate 26 and the chips 28-38 and 106 are then allowed to float between the two conformal heat transfer interfaces. Alternatively, O-rings are added to increase the stability of the double-sided substrate 26. Other than the addition of the second conformal interface, the embodiment of FIG. 3 is identical to that of FIG. 1, so that the reference numerals of FIG. 1 have not been changed.

Optionally, more than one metallic membrane can be used on a single side of the substrate 26, if integrated circuit chips on that side differ significantly in size. Moreover, the double-sided cooling of FIG. 1 can be used in embodiments that do not include the conformal heat transfer interfaces described above. That is, the advantages of first and second opposed heat sinks to provide first and second thermal energy flow paths from a multi-chip substrate may be achieved without including a deformable liquid-backed membrane.

I claim:

1. An electronic module comprising:
   a substrate having a component surface,
   a plurality of semiconductor chips mounted on said component surface of said substrate,
   a heat exchanger having a region adjacent to said component surface,
   means for supporting said substrate to said heat exchanger,
   an electrically conductive membrane coupled to said heat exchanger in generally parallel relationship to said component surface, a portion of said membrane spaced apart from said heat exchanger to define a fluid-tight, fixed-volume chamber, and
   a volume of generally static liquid sealed fluid tightly within said chamber, said static liquid pressing said membrane into compression contact with said semiconductor chips, said membrane being deformable to compensate for variations in heights and angles among said semiconductor chips,
   whereby said liquid is in non-flow heat transfer relation with said heat exchanger and said membrane forms an electrical path from said heat exchanger to said semiconductor chips.

2. The module of claim 1 wherein said membrane is a thin deformable member, said membrane being made of a metal having high electrical and thermal conductivities.

3. The module of claim 2 wherein said heat exchanger is at ground potential.

4. The module of claim 1 wherein each of said membrane and said static liquid has a high thermal conductivity to conduct heat from said semiconductor chips to said heat exchanger.

5. The module of claim 1 further comprising a second heat exchanger member on a side of said substrate opposite to said component surface, said heat exchanger and said second heat exchanger member being mechanically coupled to encase said substrate, said heat exchanger and said second heat exchanger member having a fixed electrical potential, thereby providing RF shielding to said semiconductor chips.

6. The module of claim 1 wherein said substrate is a silicon substrate.

7. The module of claim 6 wherein said static liquid is a solution of distilled water and ethylene glycol.

8. The module of claim 1 wherein said substrate is sealed from the ambient atmosphere, said heat exchanger forming a portion of a housing for sealing said substrate.

9. The module of claim 1 further comprising a tape automated bonding frame for electrically connecting said module to an external member.

10. A module having a plurality of semiconductor chips comprising:
    a substrate having opposed first and second major sides,
    a plurality of electrical components mounted to at least said first major side,
    a first heat exchanger means at said first major side for conducting thermal energy generated by said components, said first heat exchanger means providing a first heat flow path from said components,
    a second heat exchanger means at said second major side for conducting thermal energy generated by said components,
    said first heat exchange comprising:
    a heat sink, a thin thermally conductive membrane attached to said heat sink and positioned to contact said electrical components, said membrane combining with said heat sink to form a fluid-tight chamber, and a substantially static thermally conductive liquid sealed within said fluid-tight chamber to provide a conformal material for bending said membrane with variations in height and skew of said electrical components relative to said substrate.

11. The module of claim 10 wherein said first and second heat exchanger means have cavities aligned to form a substrate chamber, said substrate being mounted within said substrate chamber.

12. The module of claim 11 further comprising lead means for providing electrical communication with said substrate, said lead means extending between said first and second heat exchanger means and having inner lead ends connected to said substrate and having outer lead ends at the exterior of said substrate chamber.

13. The module of claim 11 further comprising means for sealing said substrate chamber, said sealing means including an O-ring surrounding said substrate chamber, said O-ring being entrapped between said first and second heat exchanger means.

14. A multi-chip module comprising:

a heat sink having a high thermal conductivity and having a liquid-containment cavity, a substrate having a plurality of integrated circuit chips electrically connected on a first side of said substrate, said substrate coupled to said heat sink for housing said chips, said chips each having opposing first and second major surfaces, each first major surface facing said first side of said substrate, each second major surface facing away from said first side of said substrate, and compensating means for providing a conformal thermal energy path from said chips to said heat sink, said compensating means having a high thermal conductivity, said compensating means comprising:

a liquid-backed member positioned to be in heat transfer relationship with each of said chips when said second major surfaces of said chips are coplanar, said liquid-backed member having a high electrical conductivity and extending substantially parallel to said substrate, and a substantially static liquid entrapped between said heat sink and said liquid-backed member to pressure said liquid-backed member to conform to said chips when said second major surfaces are non-coplanar, said static liquid being in a generally non-flow condition within said liquid-containment cavity of said heat sink, said second major surfaces of said chips being electrically grounded via said liquid backed member and said heat sink.

* * * * *